(12) United States Patent
Chou

(10) Patent No.: US 8,368,447 B1
(45) Date of Patent: Feb. 5, 2013

(54) DELAY LOCK LOOP CIRCUIT

(75) Inventor: Min-Chung Chou, Hsinchu (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 0 days.

(21) Appl. No.: 13/217,293

(22) Filed: Aug. 25, 2011

(51) Int. Cl.
*H03L 7/06* (2006.01)
(52) U.S. Cl. .......................... 327/158; 327/149
(58) Field of Classification Search ............... 327/149, 327/158
See application file for complete search history.

(56) References Cited

U.S. PATENT DOCUMENTS

| | | | |
|---|---|---|---|
| 7,046,059 B2 | 5/2006 | Kwak | |
| 2008/0204094 A1* | 8/2008 | Hur | 327/158 |
| 2010/0194459 A1 | 8/2010 | Milton | |
| 2011/0090940 A1* | 4/2011 | Wadhwa et al. | 375/219 |
| 2011/0128056 A1* | 6/2011 | An | 327/158 |
| 2011/0227622 A1* | 9/2011 | Kang | 327/165 |
| 2012/0194238 A1* | 8/2012 | Maneatis et al. | 327/157 |

* cited by examiner

*Primary Examiner* — Adam Houston
(74) *Attorney, Agent, or Firm* — Jianq Chyun IP Office

(57) ABSTRACT

The invention provides a delay lock loop circuit (DLL) for generating a locked signal, the DLL circuit includes: a phase detector, a first and a second voltage controlled delay chains, a charge pump and a duty cycle detection pump. The phase detector generates a phase detecting result by detecting a phase difference between the clock signal and the locked signal. The first and the second voltage controlled delay chains generate a first and a second delayed signals by delaying the clock signal according to the first and the second control signals, respectively. The charge pump is used for generating the first and the second control signal according to the phase detecting result. The duty cycle detection pump is used for controlling a voltage level of the second control signal according to the first and the second delayed signals.

13 Claims, 5 Drawing Sheets

100

DELAY LOCK LOOP CIRCUIT

BACKGROUND

1. Field of the Invention

The invention relates to a delay lock loop (DLL) circuit. Particularly, the invention relates to a delay lock loop circuit capable of generating a locked signal with 50% duty cycle.

2. Description of Related Art

According to a conventional technique, a delay lock loop (DLL) circuit is used for a synchronous semiconductor memory device in order to synchronize an internal clock signal with an external clock signal. In the synchronous semiconductor memory, data accessing operations such as a read operation and a write operating are performed in synchronous with rising edges and falling edges of the external clock signal. Since there is a time delay while the external clock signal is inputted to the synchronous semiconductor memory, such as the DLL is employed for synchronizing an internal clock signal with the external clock signal by compensating the time delay between the internal clock signal and the external clock signal.

However, in case of a double data rate (DDR) synchronous semiconductor memory device, the data accessing operations are performed at both of the rising edges and the falling edges of the internal clock signal. Therefore, it is required that the internal clock signal have a 50% duty cycle.

SUMMARY OF THE INVENTION

The invention is directed to a delay lock loop (DLL) circuit, which can generate a locked signal with 50% duty cycle.

The invention provides a delay lock loop circuit (DLL) for generating a locked signal, the delay lock loop circuit includes: a phase detector, a first voltage controlled delay chain, a second voltage controlled delay chain, a charge pump and a duty cycle detection pump. The phase detector is used for receiving a clock signal and the locked signal, and generating a phase detecting result by detecting a phase difference between the clock signal and the locked signal. The first voltage controlled delay chain coupled to the phase detector, for receiving the clock signal and a first control signal, and generating a first delayed signal by delaying the clock signal according to the first control signal. The second voltage controlled delay chain coupled to the phase detector, for receiving the clock signal and a second control signal, and generating a second delayed signal by delaying the clock signal according to the second control signal. The charge pump coupled to the phase detector, the first and the second voltage controlled delay chains. The charge pump is used for receiving the phase detecting result and generating the first and the second control signals according to the phase detecting result. The duty cycle detection pump coupled to the charge pump and the first and the second voltage controlled delay chains. The duty cycle detection pump is used for receiving the first and the second delayed signals and controlling a voltage level of the second control signal according to the first and the second delayed signals.

According to the above descriptions, in the invention, the duty cycle detection pump is provided to control the voltage level of the second control signal. Accordingly, the triggered time difference between the first delayed signal and the second delayed signal is adjusted, such as that, the duty cycle of the locked signal is fine tuned. That is, the locked signal outputted by the delay lock loop circuit with 50% duty cycle can be obtained.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
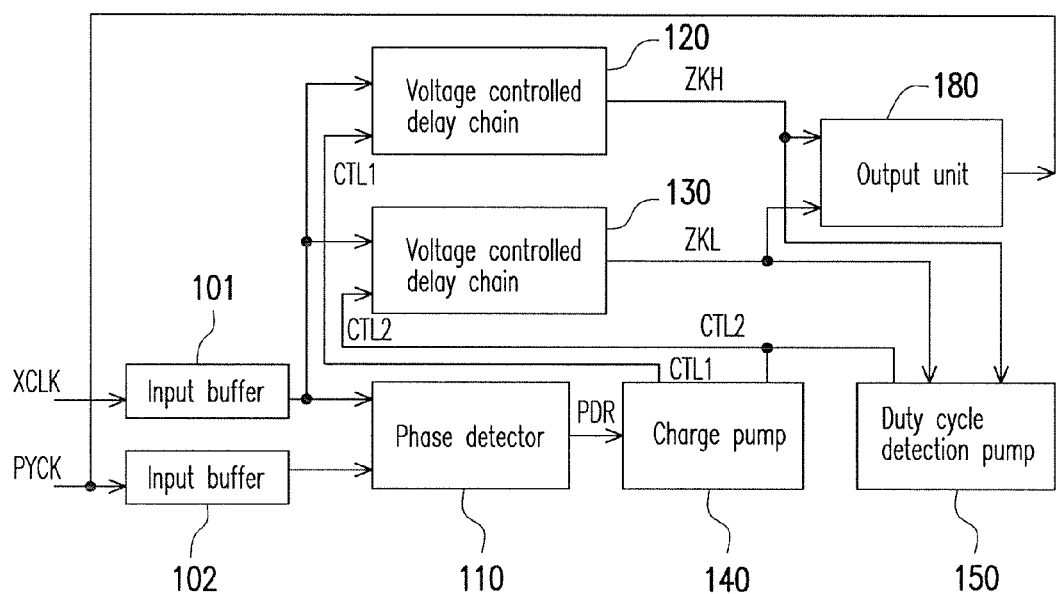
FIG. 1 is a block diagram of delay lock loop circuit according to an embodiment of the present invention.

Please refer to FIG. 1. FIG. 1 is a block diagram of delay lock loop circuit 100 according to an embodiment of the present invention. The delay lock loop circuit 100 includes input buffers 101 and 102, a phase detector 110, voltage controlled delay chains 120 and 130, a charge pump 140, a duty cycle detection pump 150 and an output unit 180. The phase detector 110 used to receive a clock signal XCLK and a locked signal PYCK through the input buffers 101 and 102 separately. The phase detector 110 generates a phase detecting result PDR by detecting a phase difference between the clock signal XCLK and the locked signal PYCK, wherein, the locked signal PYCK is generated by the output unit 180. Moreover, the charge pump 140 coupled to the phase detector 110. The charge pump 140 receives the phase detecting result PDR, and generates control signals CTL1 and CTL2 respectively according to the phase detecting result PDR.

The voltage controlled delay chain 120 is coupled to the input buffer 101, the phase detector 110 and the charge pump 140. The voltage controlled delay chain 120 receives the clock signal XCLK through the input buffer 101, and further receives the control signal CTL1 from the charge pump 140. The voltage controlled delay chain 120 delay the clock signal XCLK to generate a delayed signal ZKH according to a voltage level of the control signal CTL1. The voltage controlled delay chain 130 is coupled to the input buffer 101, the phase detector 110, the charge pump 140 and the duty cycle detection pump 150. The voltage controlled delay chain 130 receives the clock signal XCLK through the input buffer 101, and further receives the control signal CTL2 from the charge pump 140 and the duty cycle detection pump 150. The voltage controlled delay chain 130 delay the clock signal XCLK to generate a delayed signal ZKL according to a voltage level of the control signal CTL2.

The voltage controlled delay chains 120 and 130 are also coupled to the duty cycle detection pump 150. The duty cycle detection pump 150 receives the delayed signals ZKH and ZKL from the voltage controlled delay chains 120 and 130, respectively. The duty cycle detection pump 150 fine tunes the voltage level of the control signal CTL2 according to the delayed signals ZKH and ZKL. In detail, the duty cycle detection pump 150 raises the voltage level of the control signal CTL2 when the delayed signal ZKH is triggered, and then the duty cycle detection pump 150 lowers the voltage level of the control signal CTL2 when the delayed signal ZKL is triggered.

Please notice here, the duty cycle detection pump 150 can judge the delayed signal ZKH is triggered or not by comparing the voltage level of the delayed signal ZKH with a threshold value. That is, when the voltage level of the delayed signal ZKH is higher than the threshold value, the duty cycle detection pump 150 judges the delayed signal ZKH is triggered, and the duty cycle detection pump 150 raises the voltage level of the control signal CTL2 correspondingly. In the other way, the duty cycle detection pump 150 also can judge the delayed signal ZKL is triggered or not by comparing the voltage level of the delayed signal ZKL with the threshold value. That is, when the voltage level of the delayed signal ZKL is higher than the threshold value, the duty cycle detection pump 150 judges the delayed signal ZKL is triggered, and the duty cycle detection pump 150 lowers the voltage level of the control signal CTL2 correspondingly.

Since the locked signal PYCK is generated by the output unit 180, and the output unit 180 generates the locked signal PYCK by change a high state and a low state according to the triggered states of the delayed signals ZKH and ZKL, separately. That is, a duty cycle of the locked signal PYCK can be controlled by tuning the triggered state of the delayed signal ZKL. In briefly, the duty cycle detection pump 150 raises the voltage level of the control signal CTL2 when the duty cycle of the locked signal PYCK is less than 50%. On the contrary, the duty cycle detection pump 150 lowers the voltage level of the control signal CTL2 when the duty cycle of the locked signal PYCK is larger than 50%. Of course, the voltage level of the control signal CTL2 can be held on when the locked signal PYCK is equal to 50%.

Figure 2A:
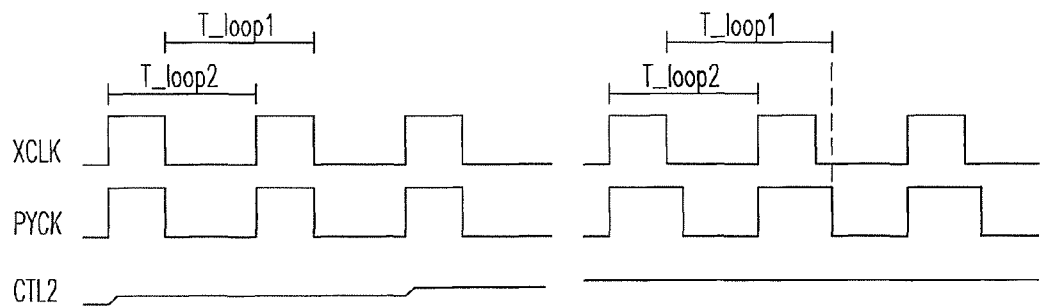
FIGS. 2A and 2B are waveform diagrams of delay lock loop circuit 100 according to an embodiment of the present invention.
Figure 2B:
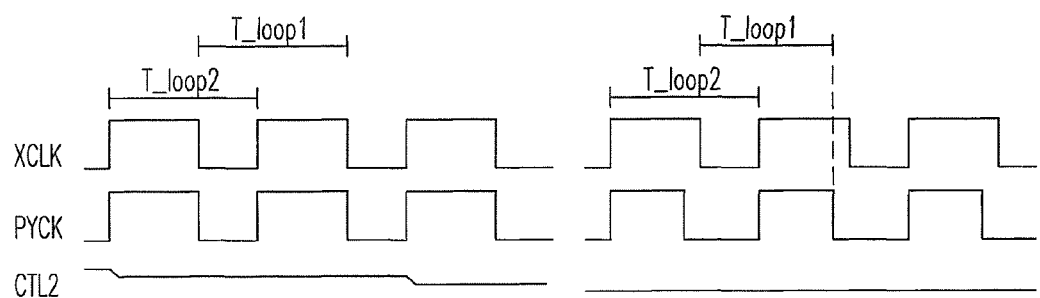

Please refer to FIGS. 2A and 2B. FIGS. 2A and 2B are waveform diagrams of delay lock loop circuit 100 according to an embodiment of the present invention. In the illustrations of FIG. 2A and FIG. 2B, the time period T_loop2 equals to the expended time of the rising edge of the clock signal XCLK through the clock signal XCLK→output of the input buffer 101→the delayed signal ZKH→the rising edge of locked signal PYCK. The time period T_loop1 equals to the expended time of the falling edge of the clock signal XCLK through the clock signal XCLK→the output of the input buffer 101→the delayed signal ZKL→the falling edge of locked signal PYCK. In FIG. 2A, the duty cycle of the locked signal PYCLK is less than 50% and the voltage level of the control signal CTL2 is raised. Such as that, the positive duty of the locked signal PYCLK is increased, and the duty cycle of the locked signal PYCLK is equal to 50%, wherein, the time period T_loop1 is increased correspondingly.

In FIG. 2B, the duty cycle of the locked signal PYCLK is larger than 50% and the voltage level of the control signal CTL2 is lowered. Such as that, the positive duty of the locked signal PYCLK is decreased, and the duty cycle of the locked signal PYCLK is equal to 50%, wherein, the time period T_loop1 is decreased correspondingly.

Figure 3:
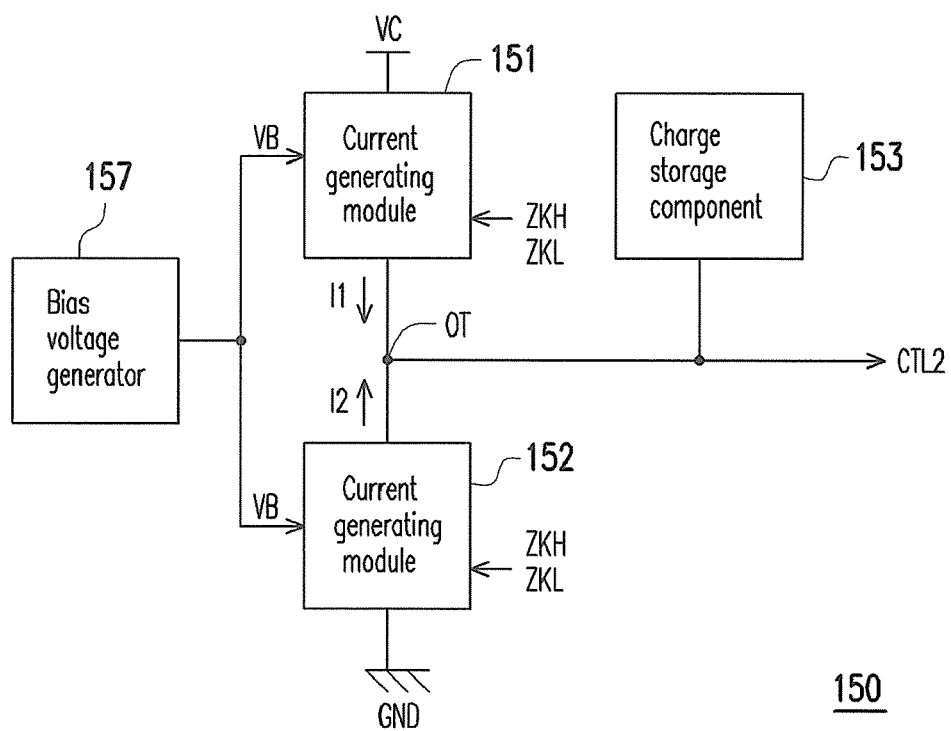
FIG. 3 is a block diagram of the duty cycle detection pump 150 according to an embodiment of the present invention.

Please refer to FIG. 3. FIG. 3 is a block diagram of the duty cycle detection pump 150 according to an embodiment of the present invention. The duty cycle detection pump 150 includes current generating modules 151 and 152, a charge storage component 153 and a bias voltage generator 157. The current generating module 151 coupled between an output terminal OT and a voltage source VC. The current generating module 151 provides a charging current I1 to the output terminal OT within a first time period, wherein, the first time period can be determined by the delayed signal ZKH. The current generating module 152 coupled between the output terminal OT and a ground voltage GND. The current generating module 152 sinks a discharging current I2 to the ground voltage GND within a second time period. Wherein, the second time period can be determined by the delayed signal ZKL, and the first time period and the second time period are non-overlapped. The charge storage component 153 coupled to the output terminal OT, and is used for generating the control signal CTL2 at the output terminal OT according to the charging current I1 and the discharging current I2.

Please notice here, when the charging current I1 is generated by the current generating module 151, the charge storage component 153 is charged and the voltage level of the control signal CTL2 is raised. On the contrary, when the discharging current I2 is sunk by the current generating module 152, the charge storage component 153 is discharged and the voltage level of the control signal CTL2 is lowered.

The bias voltage generator 157 coupled to the current generating modules 151 and 152, and the bias voltage generator 157 provides bias voltage VB to the current generating modules 151 and 152. The current generating modules 151 and 152 receive the bias voltage VB for controlling current values of the charging current I1 and the discharging current I2.

Figure 4:
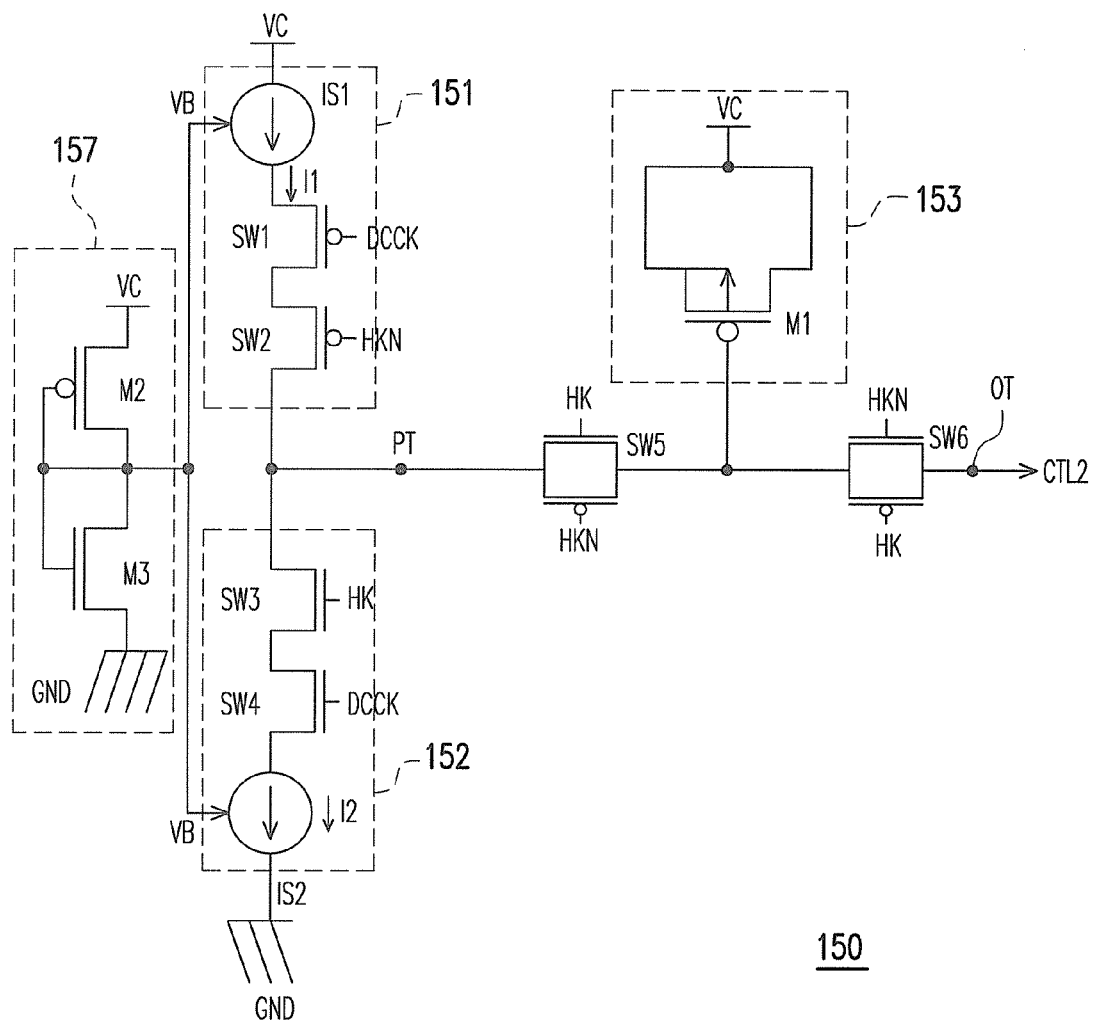
FIG. 4 is a circuit diagram of the duty cycle detection pump 150 according to an embodiment of the present invention.

Please refer to FIG. 4. FIG. 4 is a circuit diagram of the duty cycle detection pump 150 according to an embodiment of the present invention. The current generating module 151 includes current source IS1 and switches SW1 and SW2. The current source IS1 coupled between the switch SW1 and the voltage source VC. The current source IS1 is a voltage controlled current source and controlled by bias voltage VB. The switches SW1 and SW2 are coupled in serial and controlled by switch control signals DCCK and HKN, separately. Wherein, the switch control signals DCCK and HKN are generated according to the delayed signals ZKL and ZKH as shown in FIG. 3. In this embodiment of present invention, the frequency of the switch control signal HKN is a half of the frequency of the switch control signal DCCK, and the switches SW1 and SW2 are constructed by transistors. When at least one of the switches SW1 and SW2 is/are turned off, a path between the charging current I1 and an end PT are cut off. When the switches SW1 and SW2 are both turned on, the charging current I1 flows into the charge storage component 153 through the switches SW1-SW2 and the end PT.

On the other hand, the current generating module 152 includes current source IS2 and switches SW3 and SW4. The current source IS2 coupled between the switch SW4 and the ground voltage GND. The current source IS2 is a voltage controlled current source and controlled by bias voltage VB. The switches SW3 and SW4 are coupled in serial and controlled by switch control signals HK and DCCK, separately. Wherein, the switch control signals DCCK and HK are generated according to the delayed signals ZKL and ZKH as shown in FIG. 3, and the switch control signals HK and HKN are complementary. In this embodiment, the frequency of the switch control signal HK is a half of the frequency of the switch control signal DCCK, and the switches SW3 and SW4 are constructed by transistors. When at least one of the switches SW3 and SW4 is/are turned off, a path between the discharging current I2 and an end PT are cut off. When the switches SW3 and SW4 are both turned on, the discharging current I2 sunk from the charge storage component 153 through the switches SW3-SW4 and the end PT. The switch control signals HKN and HK can be generated by a switch control signal generator (not illustrated).

The charge storage component 153 is a capacitor constructed by a transistor M1. In this embodiment, the gate of the transistor M1 is coupled to the end PT, and the drain, the source and the bulk of the transistor M1 are all coupled to the voltage source VC. Moreover, a switch SW5 coupled between the end PT and the charge storage component 153, and a switch SW6 coupled between the charge storage component 153 and the output terminal OT. The switches SW5 and SW6 are constructed by a logical gate named transmission gate, and the switches SW5 and SW6 are controlled by the switch controlled signal HK and HKN. Furthermore, the turned on/off states of the switches SW5 and SW6 are complementary. That is, when the switch SW5 is turned on, the switch SW6 is turned off, and when the switch SW5 is turned off, the switch SW6 is turned on.

The bias voltage generator 157 includes a P-type transistor M2 and an N-type transistor M3. The gates of the transistor M2 and M3, the drains of the transistor M2 and the transistor M3 are connected together for generating the bias voltage VB. The source of the transistor M2 is coupled to the voltage source VC and the source of the transistor M3 is coupled to the ground voltage GND.

Figure 5:
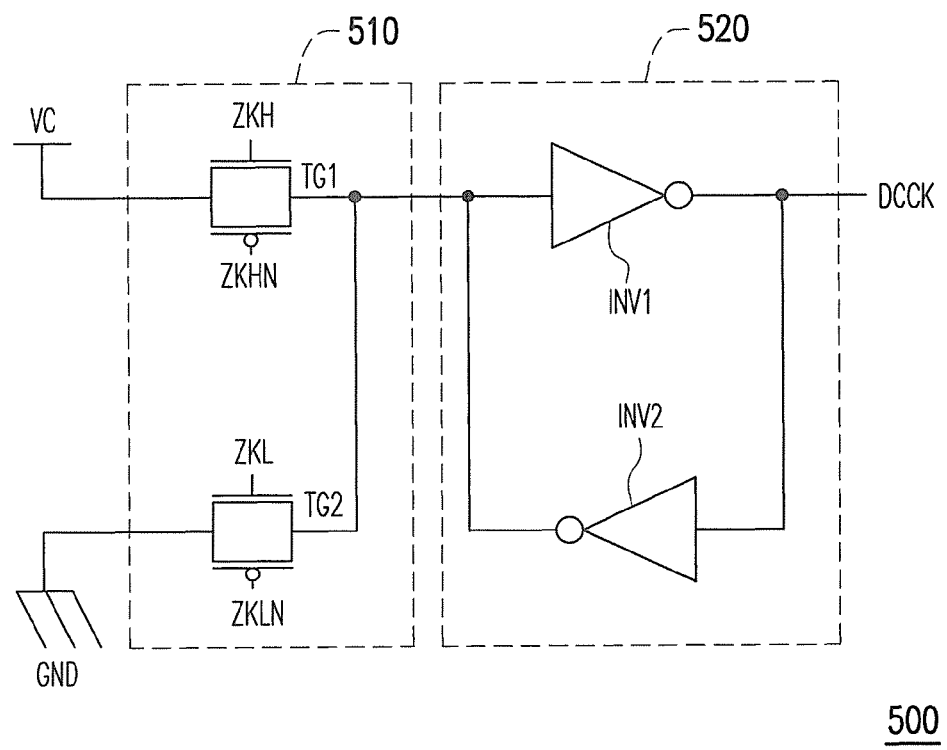
FIG. 5 is a circuit diagram of the switch control signal generator 500 according to an embodiment of the present invention.

Please refer to FIG. 5. FIG. 5 is a circuit diagram of the switch control signal generator 500 according to an embodiment of the present invention. The switch control signal generator 500 includes a multiplexer 510 and a latch 520. The multiplexer 510 includes transmission gates TG1 and TG2. The transmission gates TG1 and TG2 receive the voltage source VC and the ground voltage GND, separately. The output ends of the transmission gates TG1 and TG2 are connected to an input of the latch 520. The latch 520 includes inverting gates INV1 and INV2. The input of the inverting gate INV1 and the output of the inverting gate INV2 coupled to the output of the transmission gates TG1 and TG2. The output of the inverting gate INV1 generating the switch control signal DCCK is coupled to the input of the inverting gate INV2.

The transmission gates TG1 and TG2 are controlled by the delayed signal ZKH, ZKHN, ZKL and ZKLN. Wherein, the delayed signal ZKHN and ZKLN are the inverse of the delayed signal ZKH and ZKL, respectively.

It should be noticed that, when the transmission gates TG1 is turned on (TG2 is turned off), the multiplexer 510 output the voltage source VC to the latch 520, and the latch 520 latches and output the switch control signal DCCK equal to the ground voltage GND. On the contrary, when the transmission gates TG2 is turned on (TG1 is turned off), the multiplexer 510 output the ground voltage GND to the latch 520, and the latch 520 latches and output the switch control signal DCCK equal to the voltage source VC.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A delay lock loop circuit, for generating a locked signal, comprising:
   a phase detector, for receiving a clock signal and the locked signal, and generating a phase detecting result by detecting a phase difference between the clock signal and the locked signal;
   a first voltage controlled delay chain, coupled to the phase detector, for receiving the clock signal and a first control signal, and generating a first delayed signal by delaying the clock signal according to the first control signal;
   a second voltage controlled delay chain, coupled to the phase detector, for receiving the clock signal and a second control signal, and generating a second delayed signal by delaying the clock signal according to the second control signal;
   a charge pump, coupled to the phase detector, the first and the second voltage controlled delay chains, for receiving the phase detecting result and generating the first and the second control signals according to the phase detecting result; and
   a duty cycle detection pump, coupled to the charge pump and the first and the second voltage controlled delay chains, for receiving the first and the second delayed signals and controlling a voltage level of the second control signal according to the first and the second delayed signals.

2. The delay lock loop circuit as claimed in claim 1, wherein the duty cycle detection pump raises the voltage level of the second control signal when the first delayed signal is triggered, and then the duty cycle detection pump lowers the voltage level of the second control signal when the second delayed signal is triggered.

3. The delay lock loop circuit as claimed in claim 2, wherein a delay time of the second delayed signal caused by the second voltage controlled delay chain is direct proportion to the voltage level of the second control signal.

4. The delay lock loop circuit as claimed in claim 1, further comprising:
   an output unit, coupled to the first and the second voltage controlled delay chains, for receiving the first and the second delayed signals and generating the locked signal according to the first and the second delayed signals.

5. The delay lock loop circuit as claimed in claim 4, wherein the output unit decides a plurality of transition times of the locked signal according to the first and the second delayed signals.

6. The delay lock loop circuit as claimed in claim 4, wherein a duty cycle of the locked signal is 50%.

7. The delay lock loop circuit as claimed in claim 1, further comprising:
   a first input buffer, coupled in a path for the phase detector receiving the clock signal; and
   a second input buffer, coupled between the output unit and the phase detector, for buffering the locked signal and transporting the locked signal to the phase detector.

8. The delay lock loop circuit as claimed in claim 1, wherein the duty cycle detection pump comprises:
   a first current generating module, coupled between a voltage source and an output terminal of the duty cycle detection pump, for providing a charging current to the output terminal within a first time period;
   a second current generating module, coupled between a ground voltage and the output terminal, for sinking a discharging current from the output terminal within a second time period; and
   a charge storage component, coupled to the output terminal, for generating the second control signal at the output terminal according to the charging current and the discharging current.

9. The delay lock loop circuit as claimed in claim 8, wherein the first time period and the second time period is determined according to the first delayed signal and the second delayed signal separately, and the first time period and the second time period are non-overlapped.

10. The delay lock loop circuit as claimed in claim 8, wherein the first current generating module comprises:
- a first current source, coupled to the voltage source, for generating the charging current; and
- a first switch, coupled between the first current source and the output terminal, the first switch is controlled by a switch control signal; and the second current generating module comprises:
- a second current source, coupled to the ground voltage, for sinking the discharging current to the ground voltage; and
- a second switch, coupled between the second current source and the output terminal, the second switch is controlled by the switch control signal.

11. The delay lock loop circuit as claimed in claim 10, wherein the duty cycle detection pump further comprises:
- a switch control signal generator, coupled to the first and the second switches, for generating the switch control signal according to the first and the second delayed signal.

12. The delay lock loop circuit as claimed in claim 8, wherein the duty cycle detection pump further comprises:
- a first switch, coupled between the first and the second current generating module and the charge storage component, for turning on or off a path for transporting the charging current and the discharging current; and
- a second switch, coupled between the charge storage component and the output terminal,
- wherein, when the first switch is turned on, the second switch is turned off, and when the first switch is turned off, the second switch is turned on.

13. The delay lock loop circuit as claimed in claim 8, wherein the duty cycle detection pump further comprises:
- a bias voltage generator, coupled to the first and the second current generating module, for generating a bias voltage, the bias voltage generator providing the bias voltage to the first and the second current generating module for controlling current values of the charging current and the discharging current.

* * * * *